(12) United States Patent
Caulkins

(10) Patent No.: US 7,882,320 B2
(45) Date of Patent: *Feb. 1, 2011

(54) MULTI-PROCESSOR FLASH MEMORY STORAGE DEVICE AND MANAGEMENT SYSTEM

(75) Inventor: Jason Caulkins, West Windsor, NJ (US)

(73) Assignee: Dataram, Inc., West Windsor, NJ (US)

( * ) Notice: Subject to any disclaimer, the term of this patent is extended or adjusted under 35 U.S.C. 154(b) by 84 days.

This patent is subject to a terminal disclaimer.

(21) Appl. No.: 12/113,606

(22) Filed: May 1, 2008

(65) Prior Publication Data

US 2008/0209116 A1    Aug. 28, 2008

Related U.S. Application Data

(63) Continuation-in-part of application No. 11/439,619, filed on May 23, 2006, now Pat. No. 7,464,240, and a continuation-in-part of application No. 11/439,620, filed on May 23, 2006, now Pat. No. 7,461,229, and a continuation-in-part of application No. 11/439,615, filed on May 23, 2006, now Pat. No. 7,424,587.

(51) Int. Cl.
*G06F 12/00* (2006.01)
*G06F 12/16* (2006.01)

(52) U.S. Cl. ................ 711/165; 711/3; 711/4; 711/103; 711/113; 711/162

(58) Field of Classification Search .............. None
See application file for complete search history.

(56) References Cited

U.S. PATENT DOCUMENTS

| | | |
|---|---|---|
| 5,129,074 A | 7/1992 | Kikuchi et al. |
| 7,103,684 B2 * | 9/2006 | Chen et al. ............ 710/62 |
| 7,383,362 B2 * | 6/2008 | Yu et al. ............ 710/22 |
| 2003/0115282 A1 | 6/2003 | Rose |
| 2006/0031389 A1 | 2/2006 | Shimozono et al. |
| 2007/0180188 A1 | 8/2007 | Fujibayashi et al. |
| 2007/0276994 A1 | 11/2007 | Caulkins et al. |
| 2008/0320214 A1 * | 12/2008 | Ma et al. ............ 711/103 |
| 2009/0193184 A1 * | 7/2009 | Yu et al. ............ 711/103 |
| 2009/0204732 A1 * | 8/2009 | Yu et al. ............ 710/22 |
| 2009/0240873 A1 * | 9/2009 | Yu et al. ............ 711/103 |

* cited by examiner

*Primary Examiner*—Jack A Lane
(74) *Attorney, Agent, or Firm*—Donald R. Boys; Central Coast Patent Agency, Inc.

(57) ABSTRACT

A data storage device has a host controller interface, a plurality of microprocessor units each having a portion of random access memory (RAM) dedicated thereto, a plurality of Flash device configurations each having dedicated bus connections to individual ones or multiples of the microprocessor units, and a dataflow controller accessible to the host controller interface for managing access to the Flash device configurations.

8 Claims, 6 Drawing Sheets

MULTI-PROCESSOR FLASH MEMORY STORAGE DEVICE AND MANAGEMENT SYSTEM

CROSS-REFERENCE TO RELATED APPLICATIONS

The present invention is a continuation-in-part (CIP) to a U.S. patent application Ser. No. 11/439,619, filed May 23, 2006 and entitled "Hybrid Solid State Disk Drive with Controller", to a U.S. patent application Ser. No. 11/439,620, filed May 23, 2006 and entitled "Software Program for Managing and Protecting Data Written to a Hybrid Solid State Disk Drive", and to a U.S. patent application Ser. No. 11/439,615, filed on May 23, 2006 and entitled "Methods for Managing Data Writes and Reads to a Hybrid Solid State Disk Drive"; disclosures of which are incorporated in their entireties at least by reference.

BACKGROUND OF THE INVENTION

1. Field of the Invention

The present invention is in the field of data storage devices including disk drives and mass storage systems and pertains particularly to processor-based data storage devices and systems for managing host access to and data management on those devices.

2. Discussion of the State of the Art

In the field of data storage, non-volatile mechanical disk drives have been developed for short and long-term data storage. Solid-state non-volatile memory has been implemented for specific data storage needs, especially in small, portable electronic computing devices such as cellular telephones, video cameras and the like.

Volatile memory is a solid-state memory typically used as a high-speed temporary memory such as random access memory (RAM) of which there are many known variations. Common versions of RAM include Dynamic Random Access Memory (DRAM) and Static Random Access Memory (SRAM) among other variations such as SDRAM.

Flash memory, on the other hand, is a solid-state, high-speed data storage solution that has, until recently, been used mainly for handheld devices like cell phones, personal digital assistants (PDAs), cameras, or Universal Serial Bus (USB) peripheral storage devices referred to as jump drives or thumb drives. Flash memory provides a non-volatile memory for storing data with read speeds approaching that of RAM. Common memory types that require management include Phase Change Memory and NAND Flash.

When referring to these memory types, the terms volatile and non-volatile are blurring as new research in memory continues and new memory types are developed. But for purpose of this specification, volatile memory shall refer to memory in which stored data is lost upon interruption of power and non-volatile memory shall refer to memory in which no power is required to retain the data stored. Flash memory is increasingly being used as primary or secondary storage memory in computing systems. Such devices are commonly known as solid state disks. Flash is also being used as cache memory in some systems.

A solid-state disk drive known to the inventor, but not as publically available prior art, includes a first portion of solid-state memory of a volatile nature, a second portion of solid-state memory of a non-volatile nature, a controller for managing the memories, and a power subsystem for protecting data in volatile memory in the event of loss of power. The drive is, in one embodiment, a hot swappable disk drive that is recognized by a host system upon boot as a destination drive for reads and writes.

A controller is provided on the disk drive for managing the memory portions as a single non-volatile memory through use of at least one integrated circuit supporting one or more sets of machine-readable instructions and a data port and buffer circuitry for bi-directional communication of data between the controller and a host system such as a computer.

The system known to the inventor uses a RAM/Flash data storage addressing method that prevents continued and repetitive writing to Flash to preserve mean time before failure (MTBF) of the Flash storage device or devices of the system. The system uses RAM as a caching memory and only writes to Flash when absolutely necessary. Another optimization of the system is rotation of Flash blocks in and out of service to further enhance wear leveling of the Flash device or aggregate of devices onboard or plugged into the disk drive.

Writing to Flash memory is comparatively slower than writing to RAM, hence the use of RAM in the above-described system to cache data for eventual write to Flash on power down, power interruption, or only when the RAM cache is full. The system described above provides a practical and economical solution for replacing mechanical hard disk drives in computers and other devices.

It has occurred to the inventor that there is a need for faster data management speeds in the computing industry in general and in particular in the area of robust servers and other business machines. While CPU speeds are at all time highs in terms of computing cycles, speeds at which data can be managed relative to disk storage on a Flash memory are still relatively slower. This has caused a barrier to extensive use of Flash memory in more robust data storage systems.

Still another disadvantage of using Flash memory as long-term storage in robust systems is that a number of writes performed on the memory is limited on a Flash memory chip and the media must be written in a manner, often proprietary, as specified by the manufacturer of the Flash memory. Such adaptations may not be readily supported by a particular host system sending the data for storage. This fact has been a basis for differing approaches to Flash memory management software and firmware that deal essentially with how data may be rendered and stored on the particular type Flash memory implemented.

Further to the above, current Flash data storage systems rely on a single central processing unit (CPU) to manage Flash tables and perform other data management tasks. A drawback is that such applications place significant performance demands on Flash-based storage and caching systems, preventing scaling of those systems to meet enterprise standards for mass data storage systems.

RAM and specific data bus contentions or issues effectively prohibit single processor Flash management schemes from scaling to a high-performance level. For example, there are many operations performed by and in conjunction with a microprocessor that compete with each other on a storage device for RAM space. Error Code Correction (ECC) and real-time data encryption are just a few of these operations that compete with address lookups, read and write requests and other important data access functions.

Current Flash memory research is resulting in faster Flash memory types that may be operated much faster than current Flash types. But RAM access and data bus contentions present problems in current architectures that cause latency and prevent full potential for faster computing. Therefore, what is needed in the art is a Flash-based storage device and data management system that can be scaled up for high-performance write and read operations without bogging down due to RAM and Bus issues.

SUMMARY OF THE INVENTION

One of several problems stated above is that it in computing where data storage is involved it is difficult to scale up to larger more robust system using a device having a single processor for managing all of the Flash data management operations over a shared bus system. It is desirable to store data in a fast, secure, and reliable manner using Flash memory as a preferred solid state medium. However, existing systems use a single complex processor over a shared bus to access the Flash media for read and write access. The result is a less than desired performance speed for read and write operations due to RAM and bus contentions by the various data management process components.

The inventor searched the art of data storage devices and systems looking for components that could be leveraged or otherwise modified to improve the flexibility, reliability and performance speed of a data storage system.

Every data storage drive depends on a processor and a bus system for reading and writing data. Most such systems are not flexible enough to be scaled up for enterprise applications that might use Flash media as the persistent storage medium because of bus and RAM contentions. Moreover, larger more complex processors are expensive and although capable of the data management tasks required of enterprise systems, suffer degradation of performance speed at levels of higher utilization.

The inventor conceptualized and subsequently provided a Flash data storage device constructed using a distributive architecture that was less expensive to implement and had fewer RAM and bus contention issues than single processor devices. The result was a better performance relative to data management speeds including reads and writes. Accordingly, in one embodiment of the invention, a data storage device is provided, comprising a host controller interface, a plurality of microprocessor units each having a portion of random access memory (RAM) dedicated thereto, a plurality of Flash device configurations each having dedicated bus connections to individual ones or multiples of the microprocessor units, and a dataflow controller accessible to the host controller interface for managing access to the Flash device configurations.

In another aspect of the invention a Flash channel configured for data storage is provided, comprising a coupled configuration of one or more Flash memory devices, a bus structure connected to the Flash device configuration, the bus including an address line, a data line, and a control line, and one or more microprocessor units also connected to the bus structure, and having a portion of RAM dedicated thereto.

In another aspect of the invention a Flash channel configured for data storage is provided, comprising two or more Flash device configurations comprising one or more Flash memory devices, two or more bus structures connected to each Flash device configuration, the bus structures each including an address line, a data line, and a control line, and a single microprocessor unit also connected to the bus structures, the microprocessor unit having a portion of RAM dedicated thereto.

BRIEF DESCRIPTION OF THE DRAWING FIGURES

DETAILED DESCRIPTION

The inventor provides a multiple processor flash-based storage device and a system for managing data relative to use of the device for data storage. The invention is enabled in detail according to the following embodiments.

Figure 1:
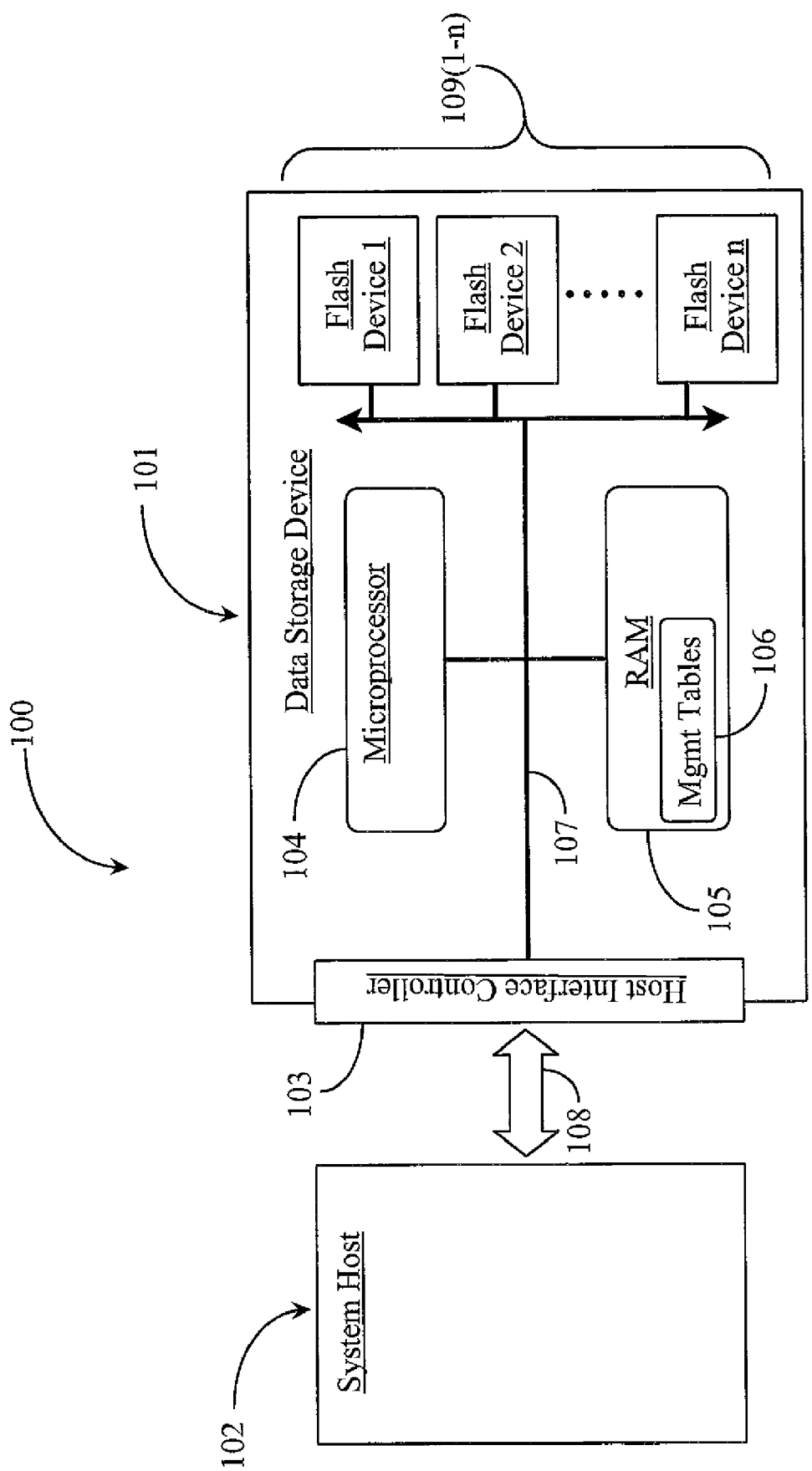
FIG. 1 is a block diagram illustrating a single processor Flash storage device according to existing art.

FIG. 1 is a block diagram illustrating a single-processor Flash storage device as known to the inventor. In this system known to the inventor and briefly described above in the background section of this specification, a single processor is used to perform all of the functions relative to reading and writing data to one or more Flash-based storage devices.

In the system of FIG. 1 data storage system 100 includes a data storage device 101 and a host computing device 102. Host computing device 102 may be a personal computer (PC) or a hand-held device such as a personal digital assistant (PDA), a Laptop computer, or some other computing device that can be coupled to data storage device 101 for the purpose of reading data from and writing data to the device.

Data storage device 101 is a solid state storage device that can be hardwired to or can be plugged into the host for use as a disk drive in place of a mechanical disk drive. Data storage device 101 has a host interface controller 103 for adapting to the host system though a computer bus. Data storage device 101 further includes a microprocessor 104 for processing commands from the host. Microprocessor 104 is connected by internal bust 107 to a random access memory (RAM) 105 used as a cache memory for the device.

Internal bus 107 connects processor 104 to host interface controller 103 and to a plurality of flash-based data storage devices 109 (1-n). Flash-based storage devices 109(1-n) may be flash chips bused in series or parallel. RAM 105 is used for all RAM-based functions including caching writes to flash for the purpose of lessening the number of actual writes that the host system makes to flash to preserve the lifespan of the flash storage devices. Data management tables for both flash space and RAM space are provided in RAM for mitigating write addressing and lookups for reading from the flash devices.

In this example writes to flash are kept to a minimum and writing to flash actually occurs in flash dumps from RAM such as when there is a power interruption, a purposeful power-down event, and when RAM space is approaching capacity. Using RAM as a fast caching system makes the application of flash-based storage more practical. However, there are limitations with this exemplary architecture that prevent this system from economical application to more robust systems like server-based storage on an enterprise scale, or mass data storage applications like redundant array of independent disk (RAID) systems and other like mass data storage systems.

The fact that only one processor is active on data storage device 101 coupled with a shared data bus produces certain performance delays in data management relative to processor speed. RAM space 105 is a precious resource on device 101. Many processes other than data write and read operations compete for available RAM space. Some of the aforementioned processes that contend for available RAM space include data encryption, error correction coding (ECC), and address lookups. Successful utilization of RAM 105 by microprocessor 104 for all RAM-based data operations suffers some degradation as RAM cache fills with pending Flash writes and as the shared data bus becomes increasingly busy with more data traffic. Providing more RAM memory is not a viable option in this example as the shared data bus is only so wide presenting a bottleneck to higher performance required for more robust systems.

Figure 2:
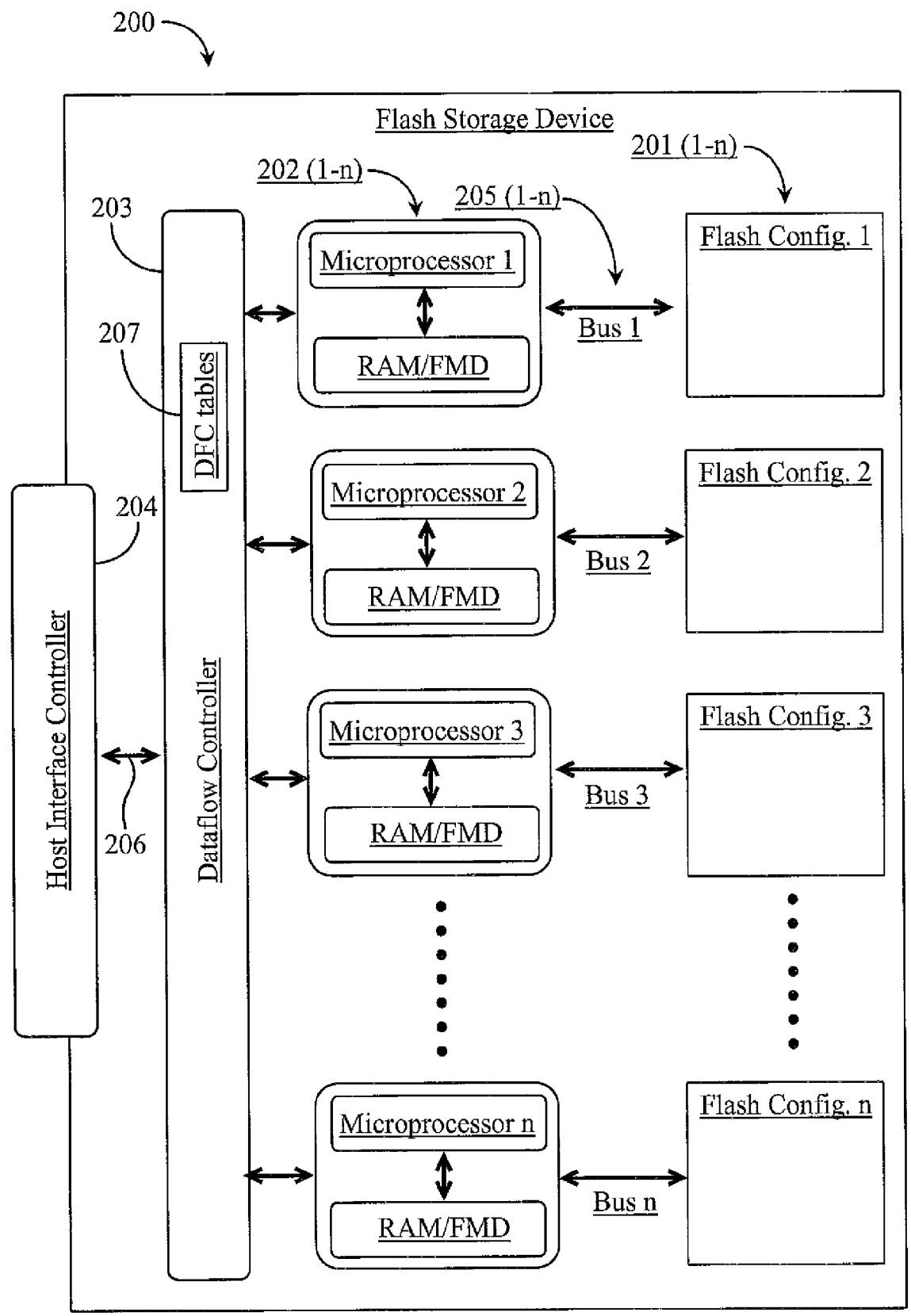
FIG. 2 is a block diagram illustrating a multi-processor Flash storage device according to an embodiment of the present invention.

FIG. 2 is a block diagram illustrating a multi-processor Flash storage device 200 according to an embodiment of the present invention. Flash storage device 200 is a solid-state data storage system using a distributed architecture and dedicated bus structures. Device 200 includes a host interface controller 204 in this example that provides an interface to a system host such as a powerful workstation or an enterprise server application. In one embodiment storage device 200 may be a shared device accessible from more than one computing station or server. Also in one embodiment device 200 may be part of an aggregation of multiple similar devices to form a server data storage rack or array of disks as in a RAID array or in a storage area network (SAN).

Flash storage device 200 may be adapted for use with a small computer system interface (SCSI) bus, parallel advanced technology attachment (PATA) or serial advanced technology attachment (SATA) protocols, integrated Drive Electronics/Advanced Technology Attachment (IDE/ATA) interface, an Enhanced Small Device Interface (ESDI), a Serial Advanced Technology Attachment, (SATA), or a Parallel Advanced Technology Attachment (PATA) interface or a Peripheral Component Interface (PCI). Disk 200 may also be adapted to work with enterprise Fibre Channel data storage networks and serial attached SCSI (SAS) networks. In this particular embodiment, disk 200 may be thought of as a solid-state mass storage device using the appropriate form factors and interfaces.

Flash storage device 200 includes a distributed processor architecture comprising multiple microprocessor units 202 (1-n). Each microprocessor unit 202 (1-n) includes a microprocessor and an onboard or bused access to a dedicated amount of RAM. The dedicated RAM is used by the microprocessor in each unit for caching and other data management functions. Microprocessor units 202 (1-n) are intended to be low cost dedicated processors that function independently of one another. Each microprocessor has a dedicated bus to one of a plurality of Flash configurations 201 (1-n).

The illustration of separate RAM/FMD in each processor unit 202(1-n) is not meant to indicate that there are completely separate and autonomous RAM units, but simply that each microprocessor unit has a dedicated portion of RAM. As described above, the dedicated portions might be all a part of a single RAM array. Moreover, Ram portions may be provided on Flash configurations where the configuration is a removable module containing one or more Flash devices and the dedicated RAM. In that case, access to RAM would be over a dedicated bus.

A Flash configuration is defined as one or more Flash memory devices configured to be accessible through a dedicated bus. A Flash channel is defined for the purpose of discussion as a bus connection from a processor, for example, to one or more Flash chips or devices illustrated logically herein, defined as a Flash device configuration or simply Flash device. Therefore, a plurality of dedicated internal bus structures 205 (1-n) is provided to complete the architecture. Flash configurations 201 (1-n) may also be referred to as Flash channels throughout this specification.

Microprocessor unit 202(1) is coupled to Flash configuration 1 (Flash device) by dedicated Bus 1. Microprocessor unit 202(2) is coupled to Flash configuration 2 by dedicated Bus 2, and so on for the number of processor units (n) on device 200. The ratio of Flash configuration to processor is one-to-one over a single bus in this example. However, this is not a strict requirement for practice of the present invention as will be detailed further below.

Each microprocessor unit 202 (1-n) has a dedicated bus connection to a unique dataflow controller 203. Dataflow controller 203 manages the data traffic over all of the Flash channels through each of the microprocessor units. Each microprocessor unit 202 (1-n) has a base address and is responsible for a single Flash channel of multiple channels 201 (1-n). The microprocessor units are completely independent and do not communicate with one another in the architecture in this particular embodiment. In other embodiments, the microprocessors distributed over the architecture may be bused for communication with each other and may share data and tasks.

Dataflow controller 203 communicates with host interface controller 204 by way of a bus illustrated herein as a bus 206. The host system may view Flash storage device 200 as a single drive or disk or according to any particular partitioning that may be implemented such as primary storage space and backup storage space. Dataflow controller 203 determines which Flash channel to use, that is, which microprocessor unit to use, according to information received in a request and according to a Flash management system implemented in RAM in each of the microprocessor units 202 (1-n).

RAM at each processor unit 202 (1-n) includes Flash management Data tables (FMD) tracking the local block addresses (LBAs) and state for the Flash memory connected to the channel to which the processor unit controls access. The actual Flash memory devices may be Phase Change Memory or NAND Flash or any other variant of Flash memory or persistent memory. Such devices may be Flash chips connected in parallel or daisy chained, and that are accessible as a configuration through a single dedicated bus. The invention may leverage existing Flash memory types and newer Flash memory types being developed. The type of RAM used at each processor may also vary. Available RAM types include SDRAM, MRAM, FRAM, and NRAM. In one embodiment Flash memory may instead be a non-volatile RAM that is suitable for use as a persistent storage space.

Dataflow controller 203 may be a state machine implemented in software or firmware. Also, dataflow controller 203 may be implemented as processor-controlled hardware. Integration between host interface controller 204 and dataflow controller 203 is also plausible and may be practiced without departing from the spirit and scope of the present invention. Application as a data storage device for a larger enterprise-scale system like a server-based system is among the many adaptation possibilities for data storage device 200.

The simple one-to-one correlation between microprocessors and Flash channels in this example is exemplary only as other ratios between processor and Flash memory may be observed in the architecture. Some of these variations are explained more fully later in this specification.

There are several optimization techniques that may implemented relative to Flash memory management in terms of reads, writes, erasures, and wear leveling. One case for using RAM has a cache memory for parking Flash data for eventual write to Flash, and uses both RAM address and Flash address tables in FMD, as is the case for the co-pending application referenced in the cross-reference section of this application. In one embodiment dataflow controller 203 selects a processor unit 202 (1-n) in sequential order for performing data access. In this scheme a first request will be filled by processor 202 (1), a next request by processor 202 (2) and so on. By the time the selection process loops back to the first processor, it is most likely free again (free of ongoing data access tasks). A goal is to have maximum throughput of data while not over utilizing or under utilizing any processing resource.

In one embodiment a random selection approach for processors is used. In this approach dataflow controller 203 may select a processor for completing a write from the host based on a random assignment of addresses. In one embodiment wear leveling is practiced in conjunction with all of the Flash channels by ensuring that data is evenly distributed over the collective Flash memory space.

Dataflow controller 203 is asynchronous and may simultaneously communicate with all microprocessor units 202 (1-n). Address and state tables (not illustrated) are provided to the dataflow controller by each of processor units 202 (1-n). In this way the dataflow controller may manage where writes occur transparently from the host. The host may view the compilation of Flash devices as a single disk according to a file system-based view used by the operating system of the host. A more primitive view or block view of the Flash memory space may also be ordered. It is noted herein that storage device 200 may be one of multiple devices comprising a mass storage system accessible from one or more machines.

Figure 3:
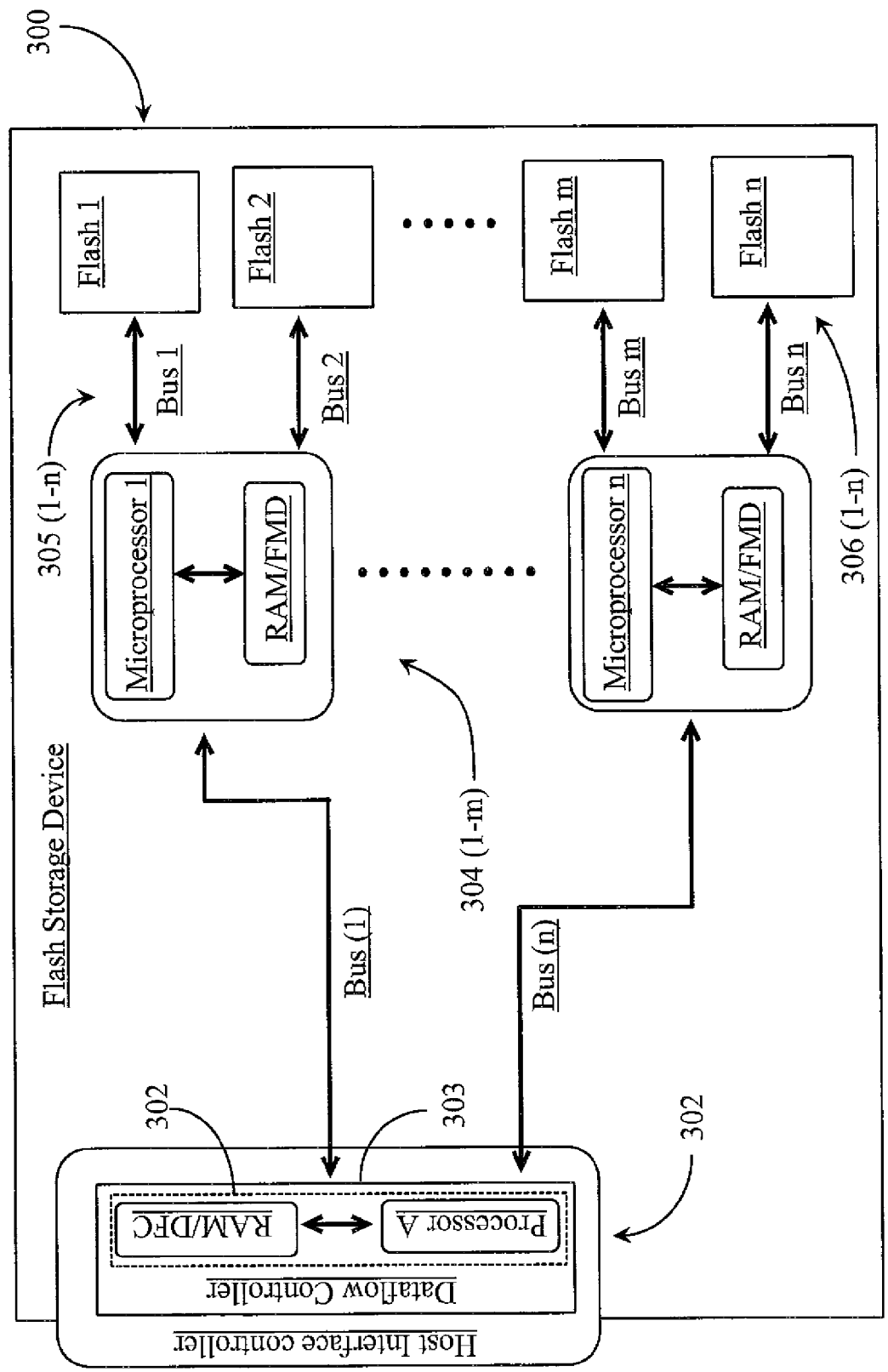
FIG. 3 is a block diagram illustrating a multi-processor Flash storage device according to another embodiment of the present invention.

FIG. 3 is a block diagram illustrating a distributed multi-processor Flash storage device according to another embodiment of the present invention. Flash storage device 300 is illustrated in this embodiment and is implemented using a distributed architecture including multiple processor units illustrated herein as microprocessor units 304 (1-n). Microprocessor units 304 (1-n) each have onboard or dedicated RAM for processing data management functions and for caching data before writing to Flash operations.

A Flash channel is defined as one or more Flash devices (in configuration) connected by a dedicated bus to a processor unit as described above. Each of Flash devices 306 (1-n) represent one or more Flash memory devices bused to a processor unit by a dedicated bus, in this example. Flash device 1 and Flash device 2 of devices 306 (1-n) in this embodiment share microprocessor unit 304 (1). Microprocessor unit 304 (1) is bused by a dedicated bus 305 (1) to Flash device(s) 306 (1) to form one complete Flash channel. The same microprocessor unit is bused by a dedicated bus 305 (2) to Flash device(s) 306 (2).

The same configuration is repeated on the device where one microprocessor unit is responsible for two Flash channels, for example, microprocessor unit 304 (n) is bused by dedicated bus 305 (m) to Flash device(s) 306 (m) and by dedicated bus 305 (n) to Flash device(s) 306 (n). In another embodiment one microprocessor unit may handle four or eight Flash channels, or other numbers of Flash channels. There are many possibilities. In this case RAM is shared for caching writes to both Flash device configurations (Flash 1, Flash 2). In this embodiment RAM is not dedicated to a single Flash channel but is dedicated to a single microprocessor unit and is shared by two Flash channels. While this may introduce some contention for RAM between the Flash channels, the fact that the channel pair earmarked by sharing one microprocessor unit is duplicated over entire device 300 makes any performance degradation negligible when compared to the performance of a single processor unit managing multiple Flash channels over a common bus.

Each microprocessor unit 304 (1-n) has a single bus connection to a data flow controller 303 integrated with a host interface controller 302. In this example dataflow controller 303 is onboard the host interface controller. Dedicated data buses 305 (1-n) may be 32-bit, 64-bit, or 128-bit wide buses, or some other bus configuration. The same can be said for all dedicated internal (onboard) buses described in the various architectures present.

Single bus connection Bus (1) from microprocessor unit 304 (1) to dataflow controller 303 may be a 32-bit, 64-bit, or 128-bit wide bus, or some other. It is possible that Bus (1) may be configured to be twice as fast as buses 305 (1-n) to allow for possible bottle-necking of data traffic on the host-side of the device 300. Other optimizations may be practiced such as RAM caching before write where the actual writes to Flash over the dedicated buses 305 (1-n) are kept to a minimum number as much as is practical. Bus (1) that connects microprocessor 304 (1) to dataflow controller 303 for communication may be a duel independent bus (DIB) or some other bus architecture that is optimized for speed.

Microprocessor unit 304(n) is bused to dataflow controller 303 by a dedicated bus n. Dataflow controller 303 includes an onboard processor 307 with a dedicated RAM with dataflow controller tables for use in microprocessor communication. Dataflow controller 303 is hosted on or integrated with host interface controller 302. It is not specifically required that dataflow controller 303 be controlled by an onboard processor to practice the present invention. The dataflow controller may be a state machine running in firmware on the host controller interface. The dataflow controller may also be controlled by a processor residing in a host system or in a system adapter without departing from the spirit and scope of the present invention. In this example, each multiprocessor unit manages data access to two independent Flash memory configurations. The Flash configuration pairs in this example do not have to be sequential such as Flash 1 and Flash 2. Microprocessor unit 304 (n) controls access to Flash m and Flash n, which may not be co-located on the Flash storage device.

Figure 4:
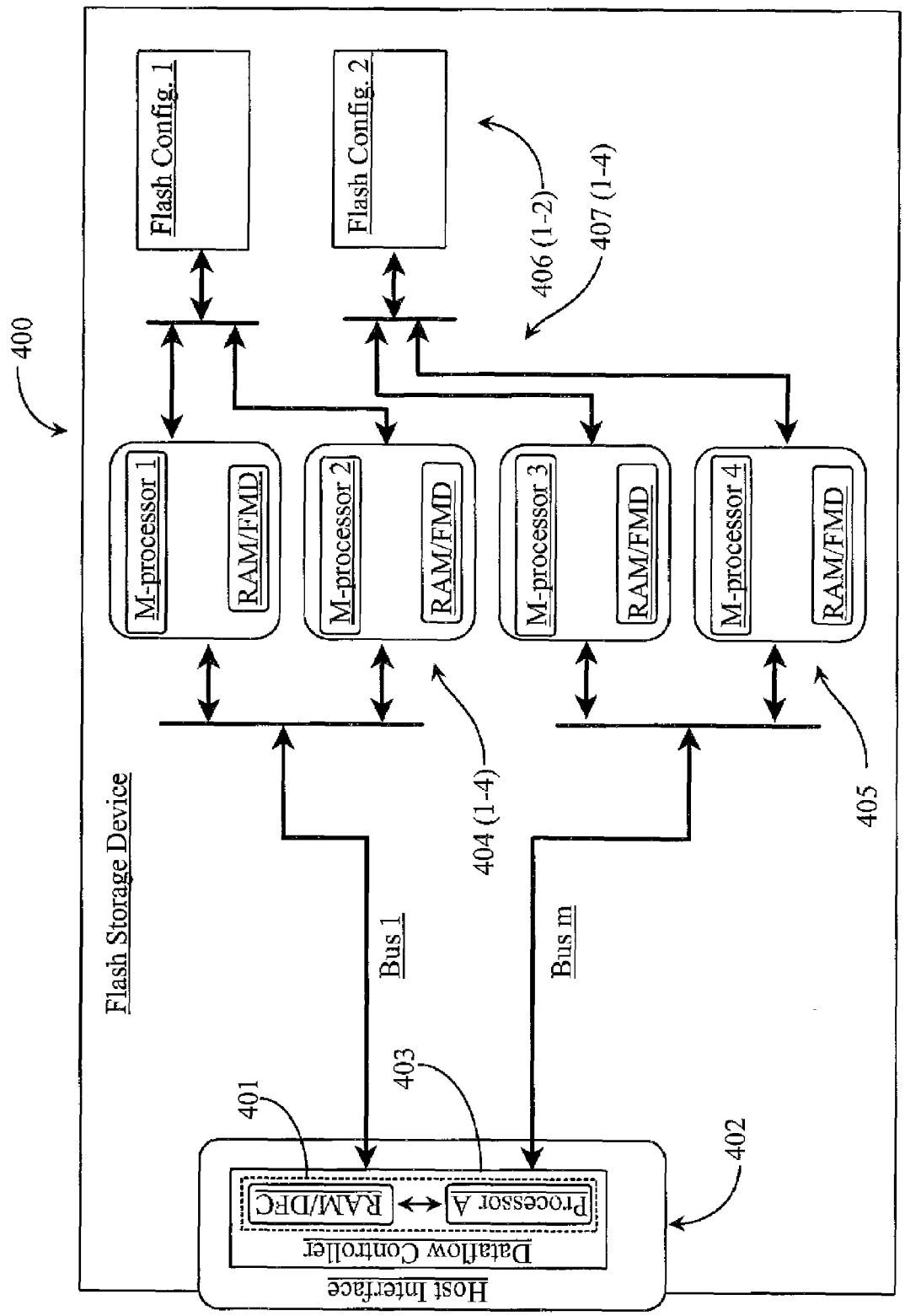
FIG. 4 is a block diagram illustrating a multi-processor Flash storage device according to a further embodiment of the present invention.

FIG. 4 is a block diagram illustrating a multi-processor Flash storage device according to a further embodiment of the present invention. A flash storage device 400 is illustrated in this example and comprises a distributed microprocessor architecture in which two microprocessor units are provided to share a single Flash configuration. Each of multiple microprocessor units 404 (1-4) in this embodiment have dedicated RAM for managing Flash access. In this example there are two Flash configurations 406 (1-2). Flash configuration or device 406 (1) has a dedicated bus to a bridge controller logically illustrated herein. On the processor side of the bridge, two dedicated bus lines 407 (1-2) connect to microprocessor units 404 (1) and 404 (2) respectively. In this example, there are possibilities for managing Flash memory somewhat differently than has so far been described.

Microprocessor units 404 (3) and 404 (4) are provided to jointly manage Flash configuration 406 (2). Bus lines 407 (3) and 407 (4) complete the connection to a bridge that supports the single dedicated bus to Flash configuration 406 (2). Moreover, each processor unit pair [microprocessor units 404 (1 and 2); microprocessor unit pair 404 (3 and 4)] is bused to a bridge on the side of a dataflow controller 403. A single bus from each bridge connects the processor units as selectable pairs to the dataflow controller. The dataflow controller recognizes each microprocessor unit pair as an entity that controls access to the total Flash space of a single Flash device configuration like device 406 (1).

In one embodiment the microprocessor unit pair of identical components is assigned a specific partition of the total Flash space for each component. For example, microprocessor unit 404 (1) may be assigned to a Flash partition in Flash configuration 406 (1) reserved for routine data storage and access. Microprocessor unit 404 (2) may be assigned to the rest of the Flash space reserved for data backup and recovery. In another embodiment Flash configuration 406 (1) may not be partitioned. Microprocessor unit 404 (1) might be provided to read and write data only, and microprocessor unit 404 (2) might be provided to perform other RAM-based functions like ECC, on device data encryption, updates to tables, wear leveling, and other functions. In one embodiment each microprocessor unit in a pair that controls one Flash device configuration is shadowed with the event activity of the other processor unit so each processor unit knows what the other processor unit is doing. In this way, work may be divided logically between the two processor units, although they may not directly communicate with one another.

In this example dataflow controller 403 includes an onboard microprocessor 401 with dedicated RAM and data flow controller tables as needed for selecting processor unit pairs. The data flow controller is built into or integrated with a host controller interface 402 as described further above with reference to FIG. 3. In this case a single internal Bus 1 connects the controller to processor unit pair 404 (1-2), and a single internal Bus 2 connects the controller to processor unit pair 404 (3-4). One with skill in the art of device engineering will appreciate that there may be many more microprocessor units and Flash configuration channels included on Flash storage device 400 than are illustrated. There may be more than two microprocessor units dedicated to a single bused Flash configuration without departing from the spirit and scope of the present invention.

In one embodiment microprocessors are hardwired to provide certain processing capabilities relative to Flash management and each microprocessor unit in a pair or grouping assumes a specific processing role in the management of the Flash device configuration. In another embodiment the microprocessor units in a pair may be programmed from a remote interface and set up to perform specific processing roles. Regardless of the underlying assignments, the host system may view the total space of all of the Flash configurations as one storage device. Likewise multiple storage devices grouped together as a rack or array of storage disks may be viewed by the host as one mass storage device.

Flash management data (FMD) may be loaded into RAM at each microprocessor unit at boot and may include Flash local block addresses (LBAs) and other state data relevant to Flash use. RAM address tables may also be loaded into RAM from Flash at each microprocessor in an embodiment where RAM caching is used to minimize writes to Flash during operation of the storage device. Dataflow controller 402 may include a microprocessor with its own RAM for managing data operations at the level of the controller such as selecting Flash channels for read and write based on requests from the host. All of the appropriate address and state tables may be uploaded to the dataflow controller from each active microprocessor at boot.

Figure 5:
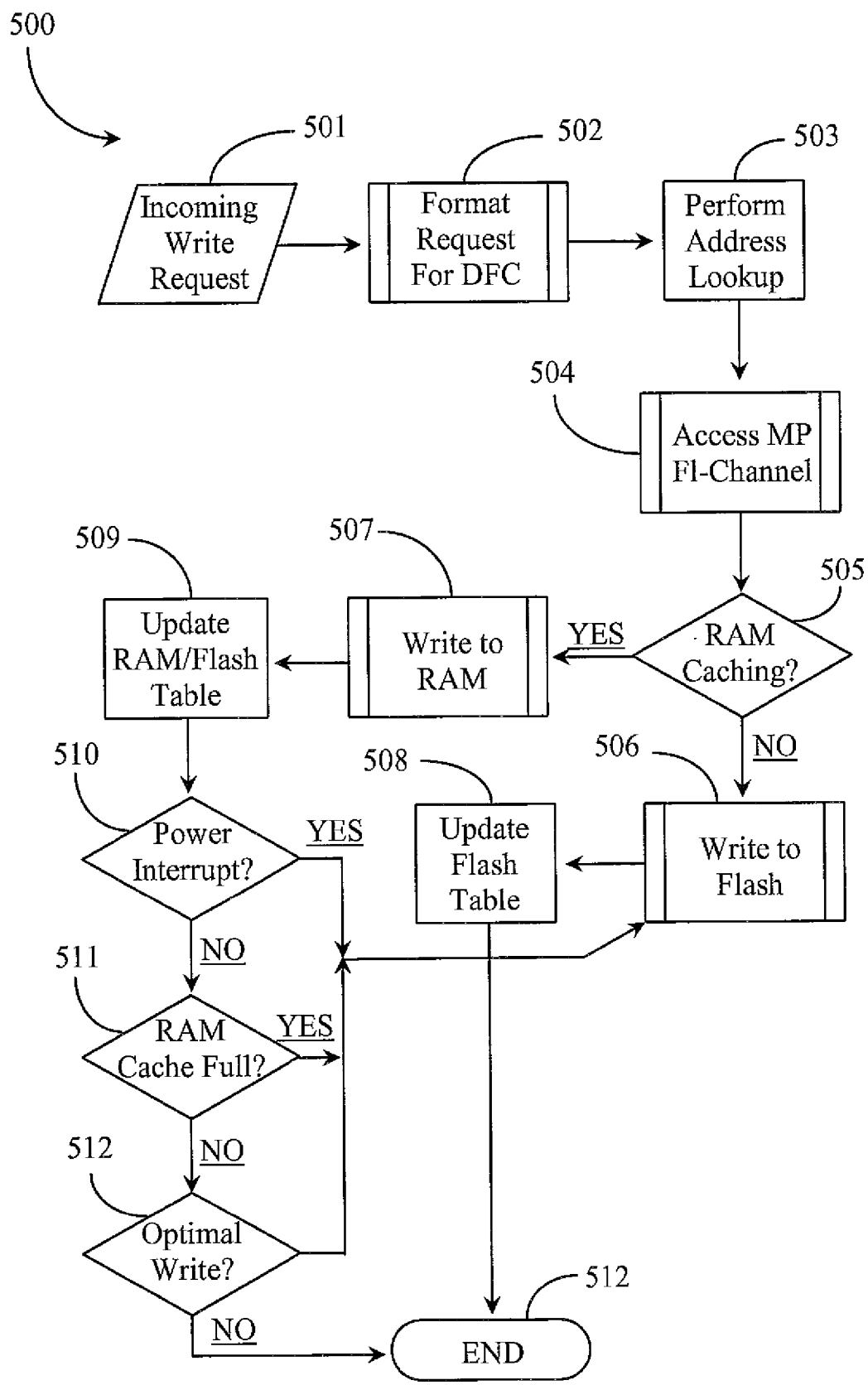
FIG. 5 is a process flow chart illustrating steps for storing data in a multi-processor Flash device according to an embodiment of the present invention.

FIG. 5 is a process flow chart illustrating steps for storing data in a multi-processor Flash device according to an embodiment of the present invention. At step 501 an incoming write request from a host system arrives at the host interface controller to write data to a storage device according to an embodiment of the present invention. At step 502 the host interface controller formats the request for the dataflow controller responsible for selecting which Flash channel to queue the request for and hands off the request to the dataflow controller.

At step 503, the dataflow controller performs an internal address lookup to determine where the write will occur. At step 504 the dataflow controller accesses the correct microprocessor unit or units and Flash channel for writing the data. At step 505 the system determines if RAM caching for Flash writes is turned on. This may be provided as a programmable mode on the Flash storage device that may be switched on or off.

If the system determines that RAM caching is activated at step 505, then the microprocessor unit charged with performing the write writes the data into RAM on the processor at step 507. The RAM on the microprocessor unit is reserved at least in part for the purpose of RAM caching if the mode is active. At step 509 the microprocessor unit updates RAM and Flash tables to record the write and reserve the Flash LBA to receive the write, although no data was actually written to Flash. Steps 501-505, 507, and 509 are repeated for each write request received from the host controller.

The write cycles may continue uninterrupted in this fashion relative to each Flash channel involving some or all of the onboard microprocessor units. If there is an interruption of power to the Flash storage device at step 510, then all writes to Flash that are valid are written to the appropriate Flash device configurations by the assigned microprocessor units across the board at step 506. A power interrupt might be an intentional event like system shutdown or re-boot. A power interruption may also be an unplanned event such as an inadvertent loss of power. A time period may be provided or configured for the system to "stay alive" while it is moving data from RAM and writing it to Flash. Some RAM types retain data without power for a period of time before losing the data. Battery backup may be provided to ensure enough time for the cycle to complete.

In one aspect where RAM caching mode is active, one or more of the microprocessor units on the Flash storage device may inadvertently lose power or fail due to some onboard error or problem. All of the writes cached in RAM at the failing microprocessor unit are, in such an event, automatically written to Flash at step 506 for that Flash channel. One exception to this rule may be where one Flash channel is a designated backup or mirror channel to the failing Flash channel.

If at step 510 there is no power interrupt, then the system may make a determination at step 511 if there are any full RAM caches on any of the microprocessor units on the Flash storage device. This determination is ongoing as dedicated RAM on one microprocessor unit may enter a full state at any time relative to other microprocessor unit RAM caches for other Flash channels. Therefore, this decision may be local to each microprocessor unit and Flash writes may occur at step 506 if the RAM cache is full for that processor unit. As data is overwritten or aged out of validity RAM cache may be purged and periodic Writes to Flash may occur on a microprocessor unit to free up the cache.

With RAM caching mode active and the system determination that no power interrupt is evident at step 510 and no full cache for a particular microprocessor unit selected for write at step 504 is eminent then at step 512 the system may determine by rule that a particular write is optimally written to Flash and not cached in RAM at step 512. In this event certain data or data types may be marked or flagged by rule for optimal Flash write overriding RAM caching for that particular write operation.

In the event of a write to Flash at step 506, the Flash table is updated at step 508 along with the appropriate RAM table if applicable. At step 512 the process ends for that write request. If none of the conditions of steps 510-512 are true in RAM caching mode then the process ends for that write at step 512 and the data stays in RAM until it is purged from RAM or eventually written to Flash when one or more of the conditional states change. If at step 505 RAM caching mode is not active, or no RAM caching mode is provided, then at step 506 the microprocessor unit writes the data to Flash. The Flash table for that Flash configuration device is updated at step 508 and the process ends for that writes at step 512.

In one aspect of the present invention RAM caching, if provided, can be selectively turned on or off for each Flash channel configured on the Flash storage device. Optimal writes may be reserved for one or more Flash channels and RAM caching may be reserved for one or more other Flash channels. There are many possibilities.

Figure 6:
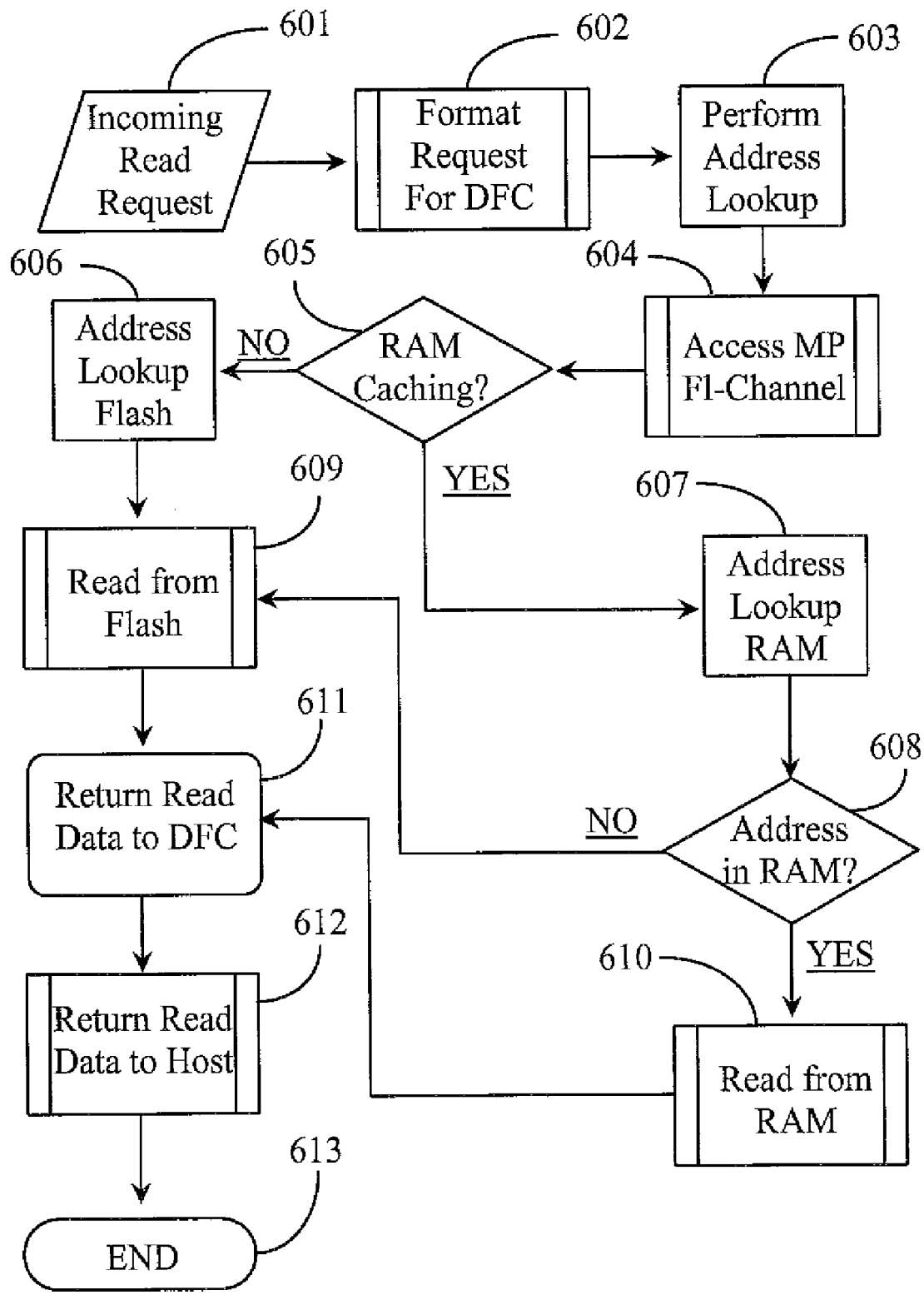
FIG. 6 is a process flow chart illustrating steps for reading from a multi-processor Flash device according to an embodiment of the present invention.

FIG. 6 is a process flow chart illustrating steps 600 for reading from a multi-processor Flash device according to an embodiment of the present invention. At step 601 a read request arrives at the host interface controller from the system host. At step 602, the request is formatted for the dataflow controller and handed off to the controller for further processing. At step 603 the system performs an address lookup to determine the correct microprocessor and Flash channel. At step 604, the dataflow controller accesses the correct microprocessor and Flash channel based on the lookup at step 603.

At step 605, the system determines if a RAM caching mode is active on the Flash channel. If at step 605 RAM caching is active then at step 607 the microprocessor performs an address lookup in RAM by default. At step 608 it is determined if the read address is currently valid in RAM. If at step 608 it is determined that the data subject to the read request is stored in RAM cache, then the microprocessor accesses RAM and reads from RAM at step 610. The microprocessor returns the read data to the data flow controller at step 611. In turn, the dataflow controller returns the read data to the host at step 612. The data flow controller may perform one or more operations on the data before handing the data to the host. In one embodiment, the data flow controller may combine the read data with read data from other channels before sending data to the host depending upon any read optimization scheme that might be implemented on the data flow controller.

At step 612 the process ends for reading from RAM. With RAM caching active at step 608, if the valid data address is not found in RAM then the system assumes the data is in Flash. At step 609, the appropriate microprocessor unit accesses the Flash channel and the data is read from Flash. Steps 611, 612, and 613 follow in the same fashion as a read from RAM.

Referring now back to step 605, if RAM caching is turned off or not provided, then steps 607, 608, and 610 are not performed. In this case at step 606 the correct microprocessor performs an address lookup for Flash. The process then proceeds to step 609 where the appropriate microprocessor unit reads from Flash. At step 611 the system returns the read data to the data flow controller. At step 612 the data flow controller sends the read data to the host. The process ends for that cycle at step 613. Although reading from Flash does not wear down the Flash memory and can be performed at speeds approaching RAM access speeds, reading from RAM with RAM caching turned on may help diminish traffic on the dedicated buses between the microprocessors and the Flash configuration devices. Each Flash channel reports its own state in tables to the dataflow controller. Each update performed by a microprocessor unit is copied to the dataflow controller. Address lookups can, in one embodiment, be performed at the level of the dataflow controller using internal updated tables freeing up the microprocessor units for read/write operations and other data management operations.

One with skill in the art of data storage devices, particularly those for more robust systems, will appreciate the flexibility that the distributed microprocessor and Flash channel architecture according to embodiments of the present invention provides for a Flash storage device. One with skill in the art will also appreciate that multiple lower cost microprocessor units running asynchronously over Flash channels on a Flash storage device such as those described herein can perform the tasks of a single, more complex processor with more reliability and comparable or superior performance speed due to RAM caching optimization and dedicated busing to the separate Flash memories of the device.

It will further be apparent to one with skill in the art that the Flash storage and data management system according to various embodiments of the present invention may be provided using some or all of the described features and components without departing from the spirit and scope of the present invention. In one embodiment, for example, a system according to the invention could be implemented using the Host CPUs for some or all of the dataflow controller functions and/or flash management. It will also be apparent to the skilled artisan that the embodiments described above are specific examples of a broader invention which may have greater scope than any of the singular descriptions taught. There may be many alterations made in the descriptions without departing from the spirit and scope of the present invention.

What is claimed is:

1. A data storage device comprising:
a host controller interface;
a plurality of microprocessor units each having a portion of random access volatile memory (RAM) dedicated thereto, the RAM portion having a preset threshold for valid data;
a plurality of non-volatile memory device configurations each having dedicated bus connections to individual ones or multiples of the microprocessor units;
a dataflow controller accessible to the host controller interface for managing access to the device configurations;
wherein the dataflow controller periodically compares valid data volume in the RAM portion associated with each microprocessor with the preset threshold, and upon a threshold being met or exceeded, selects and moves data that has been longest in the volatile memory portion without alteration from the RAM portion to the non-volatile memory bussed to that microprocessor, and marks locations from which the data is moved as available for writing in the volatile portion.

2. The data storage device of claim 1 wherein the device configurations bused to ones or multiples of the microprocessor units comprise individual Flash channels selectable for service from the dataflow controller.

3. The data storage device of claim 2 wherein the Flash device configuration of each selectable Flash channel comprises multiple Flash chips connected in parallel.

4. The data storage device of claim 2 wherein the Flash device configuration of each selectable Flash channel comprises multiple Flash chips connected in a daisy chain configuration.

5. The data storage device of claim 1 wherein the dataflow controller includes an onboard microprocessor with a dedicated amount of RAM.

6. The data storage device of claim 1 wherein the dataflow controller is a state machine.

7. The data storage device of claim 1 wherein the dataflow controller is hardware with a microprocessor and a dedicated portion of RAM integrated with the host controller.

8. The data storage device of claim 1 wherein the memory device configurations for each channel are of a type of NAND Flash or Phase Change Memory.

* * * * *